United States Patent [19]

Ogawa et al.

[11] Patent Number: 5,099,388
[45] Date of Patent: Mar. 24, 1992

[54] ALUMINA MULTILAYER WIRING SUBSTRATE PROVIDED WITH HIGH DIELECTRIC MATERIAL LAYER

[75] Inventors: Masahiro Ogawa, Aichi; Kozo Yamasaki, Gifu; both of Japan; Mitsuru Hirano, Santa Clara, Calif.; Michael A. Schmitt; Bidyut K. Bhattacharyya, both of Chandler, Ariz.

[73] Assignees: NGK Spark Plug Co., Ltd., Aichi, Japan; NGK Spark Plugs (U.S.A.), Inc., Torrance, Calif.; Intel Corporation, Chandler, Ariz.

[21] Appl. No.: 538,334

[22] Filed: Jun. 15, 1990

[30] Foreign Application Priority Data

Jun. 15, 1989 [JP] Japan .................................. 1-153254

[51] Int. Cl.$^5$ .............................................. H01G 4/10
[52] U.S. Cl. ...................................... 361/321; 361/283
[58] Field of Search ................................ 361/321, 283

[56] References Cited

U.S. PATENT DOCUMENTS 4,816,323  3/1989  Inoue ...................................... 361/321

Primary Examiner—Brian W. Brown
Assistant Examiner—Khanh Dang
Attorney, Agent, or Firm—Finnegan, Henderson, Farabow, Garrett, and Dunner

[57] ABSTRACT

An alumina multilayer wiring substrate having a high dielectric, low inductance capacitor in the substrate on which a VLSI is to be mounted to effectively eliminate electrical noise(s) which may hinder the operation of the VLSI at high speed (frequency) is provided.

12 Claims, 3 Drawing Sheets

ALUMINA MULTILAYER WIRING SUBSTRATE PROVIDED WITH HIGH DIELECTRIC MATERIAL LAYER

BACKGROUND OF THE INVENTION

1. Field Of The Invention

The present inventions finds its utility in providing high dielectric, low inductance capacitance in the vicinity of a VLSI chip.

2. Prior Art

One current technological trend is to develop an integrated circuit having an operating speed (frequency) greater than that of its predecessors. Electronic noise can hinder the operation of the circuit. The noise interference is especially pronounced at the higher frequencies. To correct this problem, conventionally, the number of power lines and ground lines has been increased in proportion to the number of input/output (I/O) lines in an integrated circuit (IC) package. Following the conventional approach, as each successive VLSI is designed, the number of power lines and ground lines is greater than that of the previous design. It is predicted that the number of power lines and ground lines will eventually equal the number of I/O lines. As such, future IC packages will be physically larger and more structurally complex than their present counterparts.

A solution to this problem, as well as to many other integrated circuit problems, is to mount a capacitor chip on the IC package. Providing the IC package with a capacitive chip reduces the number of power lines and ground lines required. However, when a capacitor chip is added, the inductance of a power line-ground line loop is increased, possibly to five times the value of the inductance present when no capacitor chip is used. As a result, it is expected that five or more chip capacitors must be mounted onto the IC package to reduce that inductance. Since it is expected that the number of power line-ground line loops can only increase given the current VLSI development trend, it is predicted that twenty or more capacitor chips would be required for an IC package given 100 power line-ground line loops. As with the conventional method of simply adding power line-ground line loops, adding chip capacitors complicates the IC package and reduces reliability and yield.

A solution to the foregoing problems is to provide a capacitor function within a multilayer wiring substrate. However, to provide the capacitor function in this manner, it has been necessary to use sheets or paste having the same composition as the substrate. It has also been necessary to laminate the conductors and the sheets or paste in multiple layers to obtain a predetermined capacitance.

Japanese Unexamined Patent Publication 59-108397 describes an alumina wiring substrate known to the art. The alumina wire substrate contains a capacitor having a collective body of tungsten particles coated with an alumina layer. This collective body is formed on an alumina wiring substrate body using alumina and tungsten as a wiring material.

The present invention addresses a structure which further eliminates noise that may hinder the operation of the VLSI at high frequencies (speeds). It is possible to provide an alumina multilayer substrate in which a low inductance capacitor is embedded by placing a very thin ceramic sheet of high dielectric material in the vicinity of a position where the VLSI chip is to be mounted.

To obtain a large capacitance through the described multilayer lamination method, the sheet or paste layer must be made thinner or the number of laminations of the sheet or paste layer must be increased. In this process, however, there have been problems reducing the sheet or paste layer thickness below 10 $\mu$m. Moreover, increasing the number of laminations and steps increases cost. Reducing the number of laminations reduces reliability, etc.

Japanese Unexamined Patent Publication 59-108397 discloses a method requiring tungsten particles to be subjected to alumina sputtering before being formed into a paste. This process is costly. Moreover, since each of the tungsten particles is large, about 1.8 $\mu$m, there is a lower limit to which the thickness of the capacitor layer may be reduced. The sputtering process is not completely effective, and the tungsten particles may not be coated sufficiently with alumina. This may cause shorting between the counter electrodes. The present invention solves the foregoing problems.

SUMMARY OF THE INVENTION

The present invention uses a high dielectric material as a composite for manufacturing a large number of thin ceramic sheets laminated one on the other in the vicinity of a portion of an alumina multilayer wiring substrate where a VLSI chip is to be mounted. The present invention incorporate a low inductance capacitor in the alumina multilayer wiring substrate to effectively eliminate noises of the VLSI. The high dielectric material used is a mixture of alumina, a basic material, and at least one of either molybdenum, molybdenum oxide, tungsten, or tungsten oxide. The molybdenum and other elements or compounds added to the alumina are generally referred to as "auxiliaries." The resultant alumina-auxiliary material is combined at a 5-50 weight percent (w/o) ratio where the weight percent represents the amount of the auxiliaries where the total quantity of alumina and auxiliaries is assumed to be 100%.

The alumina wiring substrates can be of various sizes and shapes depending upon the particular application. The alumina wiring substrate may be composed of any combination of materials as long as alumina is the main component. Various auxiliaries may be included depending upon the intended application.

The high dielectric material may contain a mixture with any one or combination of the aforementioned auxiliaries. Molybdenum or tungsten are most commonly used. Molybdenum is preferred for its ease in sintering. Tungsten is preferred because of its stability at high temperatures. If the weight percent of the auxiliaries is less than 5 w/o, the effect of adding the auxiliaries is negligible because the dielectric constant cannot be made sufficiently large. On the other hand, if the weight percent of the auxiliaries exceeds 50 w/o, the conductivity can be increased to a level where shorting occurs. If the ratio is kept between 5-50 w/o, one can obtain excellent results without exhibiting any of the foregoing defects.

BRIEF DESCRIPTION OF THE DRAWINGS

Other features and advantages of the present invention will become apparent from the following detailed description thereof, as well as the practice of the invention, the description between taken together with the drawing, in which.

DESCRIPTION OF THE PREFERRED EMBODIMENT

Figure 1:
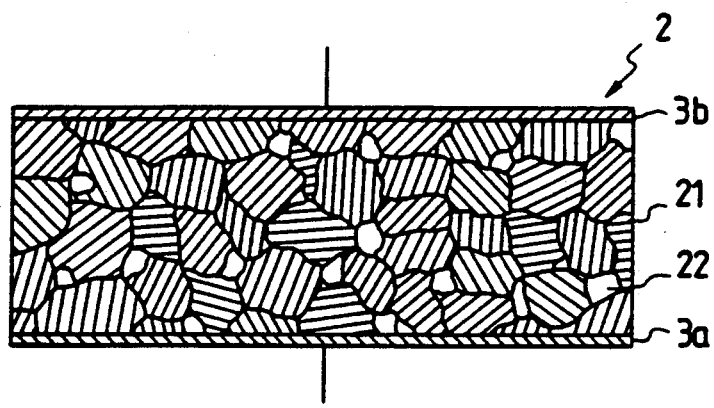
FIG. 1 is an illustration of the capacitor layer of the present invention, showing the theoretical crystalline structure of the dielectric material.
Figure 2:
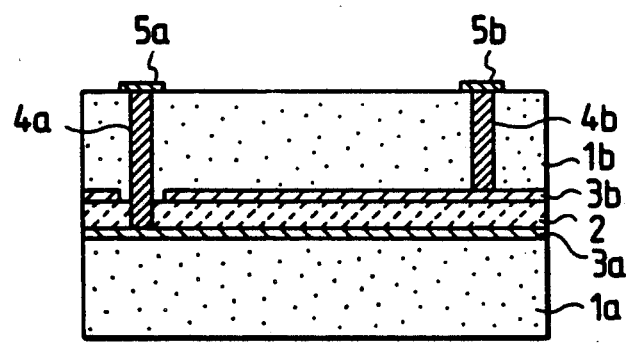
FIG. 2 is an illustration of the alumina multilayer wiring substrate showing the positioning of the dielectric material.

The present invention will first be described generally. Specific examples follow the general description.

The present invention consists of an upper substrate 1a and a lower substrate 1b with a high dielectric material 2 disposed therebetween. On either surface of the high dielectric material are metallized layers, an upper metallized layer 3a, and a lower metallized layer 3b. The upper metallized layer 3a is sandwiched between the high dielectric material layer 2 and the upper alumina substrate 1a. The lower metallized layer 3b is sandwiched between the high dielectric material layer 2 and the lower alumina substrate 1b. Conductors, 4a and 4b, are connected respectively to the upper metallized layer 3a and the lower metallized layer 3b. The conductors 4a and 4b extend from the metallized layers 3a and 3b respectively to the exterior surface of the lower alumina substrate 1b. Electrode layers 5a and 5b are attached respectively to each of conductors 4a and 4b at the exterior surface of the lower alumina substrate 1b to provide exterior contact points. The high dielectric material layer 2, the upper metallized layer 3a, and the lower metallized layer 3b are collectively called the capacitor layers C.

To form the alumina multilayer wiring substrate of the present invention, the component sheets, the upper alumina (green) layer (sheet) 1a (about 0.5-0.6 mm thick), the lower alumina (green) layer (sheet) 1b (about 0.5-0.6 mm thick), and a high dielectric material (green) layer (sheet) 2 (about 40-50 $\mu$m thick) need to be fabricated. The high dielectric material layer sheet 2 can be prepared by sufficiently dispersing molybdenum oxide ($MoO_3$) having a particle size of 10 $\mu$m or less (preferably 0.5-3.0 $\mu$m) within the alumina. A binder material is then added. The resultant mixture is then formed into a sheet and dried. Paste containing as its principle component a high melting point metal such as tungsten or molybdenum is applied or printed into the upper and lower surfaces of the high dielectric layer sheet 2 to form metallized layers 3a and 3b.

After applying layers 3a and 3b, holes are punched at predetermined positions into the alumina substrate layer (sheet) 1b the upper metallized layer 3a, and the high dielectric material 2. The upper and lower alumina layers 1a and 1b are then laminated onto the capacitor layers, C. Conductive paste is then poured into the holes to form conductors 4a and 4b. Conductive layers 5a and 5b are formed on the exterior of the lower alumina layer 1b. The conductive layers 5a and 5b are electrically connected to the conductors 4a and 4b. Alternatively, the conductor layers 5a and 5b may be formed prior to lamination of the alumina layers 1a and 1b to the metallized layers 3a and 3b. The entire structure is then fired (co-fired) in an atmosphere of mixed hydrogen and nitrogen gas at 1600° C. for about 3 hours.

The hydrogen atmosphere allows the molybdenum oxide to reduce and become molybdenum metal during the firing process. The same is true for the tungsten oxide. The advantage of using the oxides of these metals is that they do reduce to their metallic form during the firing process. Accordingly, any alternative compounds may be substituted for these oxides as long as the compounds reduce to molybdenum or tungsten metal after firing. The crystal structure of the high dielectric material layer 2 is represented in FIG. 1; 21 represents the alumina while 22 designates the molybdenum oxide.

As the concentration of the molybdenum oxide is increased, so is the dielectric constant. However, if the weight percent concentration of the auxiliary exceeds 50 w/o, electrical shorting may occur. If the weight percent concentration of the auxiliary falls below 5 w/o, the effect of the addition is not large enough to produce a sufficiently large dielectric constant. As such, the preferred range of addition of auxiliary to alumina lies between 5 and 50 w/o. It should be noted that the dielectric loss does not so increase, even if the molybdenum oxide is added to constitute 40 w/o. It is possible to create a high dielectric material layer 2 not susceptible to electrical shorting. If the molybdenum particle size is small (0.5-3.0 $\mu$m), the reliability of the present invention increases because electrical shorting is prevented.

The present invention is not limited solely to the embodiment or process described above. The sheet method need not be used, but the capacitor layer could be formed by applying a paste to a metallized layer or an upper aluminum layer (sheet) 1a. In this case, a thin layer (of thickness $\leq$ 10 $\mu$m) can easily be formed. The present invention is not limited to the case where the capacitor layer is fixed between alumina layers 1a and 1b. The number of laminations of wiring substrates is not limited to a fixed value.

EXAMPLE 1

As a first example of the present invention, the substrate of the present invention was produced in the manner as described above. Molybdenum oxide having a particle size of 10 micrometers or less was added to alumina and sufficiently dispersed within the alumina. A binder was added to the mixture which was then formed into a sheet and allowed to dry. Subsequently, a paste containing primarily a high melting point material such as tungsten or molybdenum was printed at predetermined positions onto the upper and lower surfaces of the dried sheet. These printed regions become the metallized layers 3a and 3b after firing.

Through holes were drilled (punched) through the printed metallized layers at predetermined positions. The upper and lower alumina layers, 1a and 1b, were then laminated onto the capacitor layer C so that the capacitor layer C was interposed between the alumina substrate layers 1a and 1b. Conductive paste was then poured into the through holes to form the respective conductors 4a and 4b. Surface conductive layers 5a and 5b were then added to provide contact points to the capacitor layer C. The electrode layers 5a and 5b may be formed after the conductive paste is poured into the holes or they may be added to the lower layer 1b prior to its lamination onto the lower metallized layer 3b.

Figure 3:
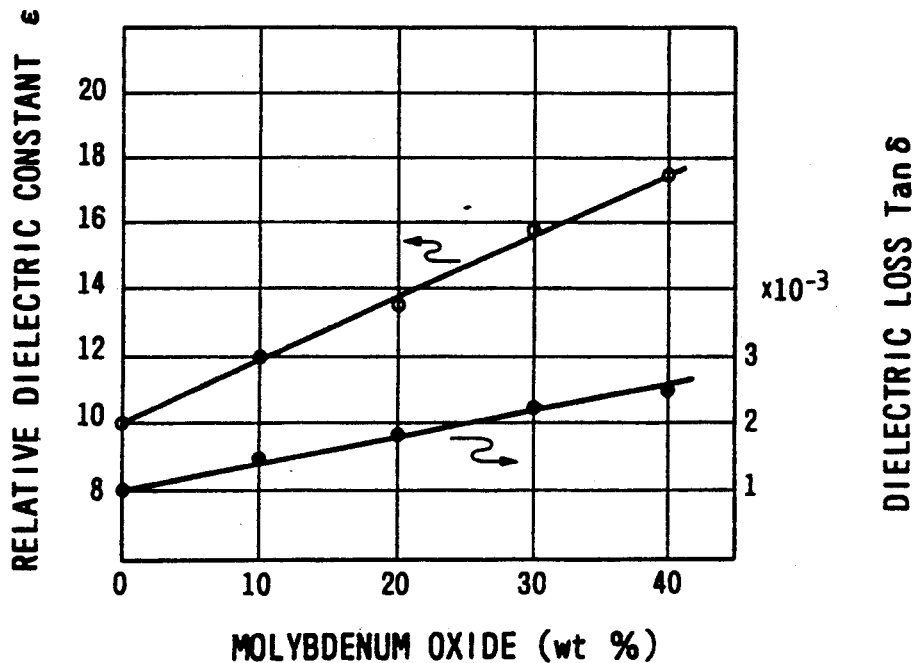
FIG. 3 is a graphical representation of the relationship between the weight percent of molybdenum oxide in the dielectric material and the relative dielectric constant of the resultant composition.

Once assembled, the entire structure was co-fired at approximately 1600° C. for approximately three hours in an atmosphere of hydrogen and nitrogen. Once produced, the dielectric constants of the present invention were measured. The weight percent composition was varied and the graph of FIG. 3 was generated from the resultant data.

The molybdenum oxide reduced in the hydrogen atmosphere during firing to leave behind an electrically conductive molybdenum layer. The same is true for tungsten. Any starting material may be alternately used as long as the composition leaves a metal molybdenum or metal tungsten in the appropriate positions after firing.

A capacitor layer constituted by a high dielectric material layer 2 of alumina 21 and molybdenum oxide 22 and metallized layers 3a and 3b as shown in FIG. 1 was formed, the high dielectric material layer 2 having the same component and being fired under the same condition as the foregoing case. As a result of measurement of the foregoing performance, the same values as the foregoing case were obtained. Therefore, only the above capacitor layers were formed after this, and investigation was made as to the effect of various rates of addition of molybdenum oxide (0, 20, 30, 40, and 50 w/o). From the results of the measurements, it was found that it is preferable that the dielectric constant becomes large as the quantity of molybdenum oxide added increases.

If the molybdenum oxide is added by 50 w/o, however, it is not preferable because electric shorting may occur. The dielectric loss, on the other hand, does not so increase even if the molybdenum oxide is added by 40 w/o.

As described above, in the wiring substrate according to the present invention, the high dielectric material layer excellent in dielectric characteristics could be easily formed without causing any shorting. When the particle diameter of used molybdenum was particularly small, i.e., about 0.5–3.0 $\mu$m, the reliability was higher because the composition of the present invention is very effective against generation of shorting.

The present invention is not limited to such a wiring substrate as shown in the foregoing specific example, and various modifications can be made to the specific example in accordance with the purposes and usages within the scope of the present invention. That is, the method of forming the foregoing capacitor layer is not limited to the above-mentioned sheet method, but the capacitor layer may be formed by applying or printing predetermined paste onto the metallized layer prepared in the form of a lower alumina green sheet. In this case, a thin layer having a thickness of 10 $\mu$m or less can be easily formed. Further, the configuration of the wiring substrate according to the present invention is not limited to such configuration wherein a capacitor layer is interposed between alumina substrates, and the number of lamination layers of wiring substrates is not limited to a fixed value.

EXAMPLE 2

Figure 4:
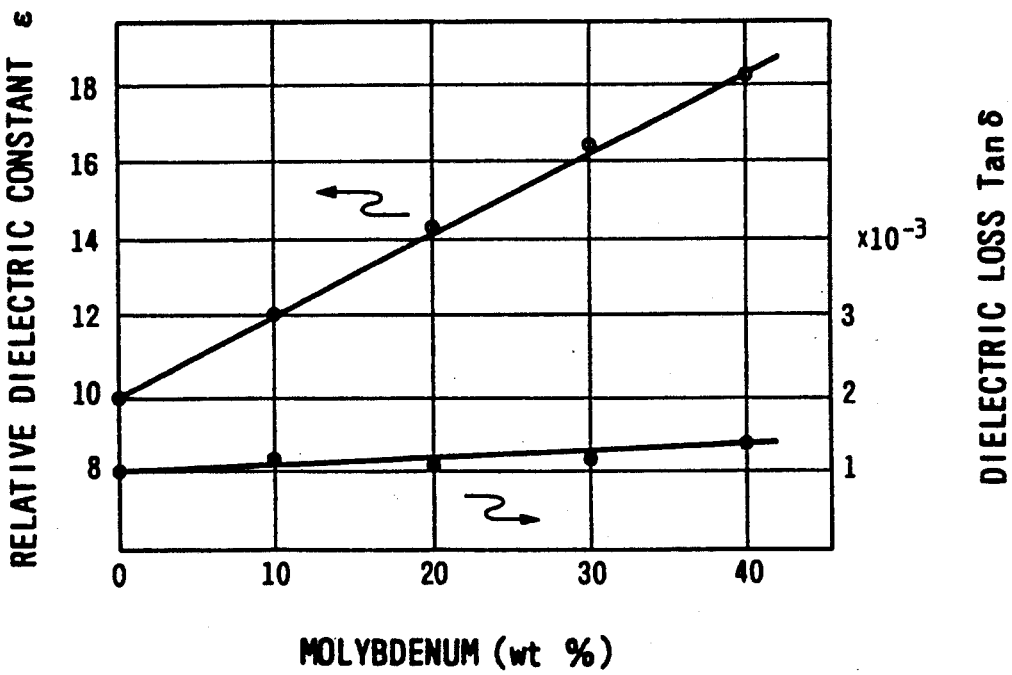
FIG. 4 is a graphical representation of the relationship between the weight percent concentration of molybdenum and the relative dielectric constant of the resultant composition.

Next, the dielectric loss of a substance having a high dielectric material layer 2 composed of alumina and molybdenum was created and its characteristics were measured. The results are presented in FIG. 4.

EXAMPLE 3

Figure 5:
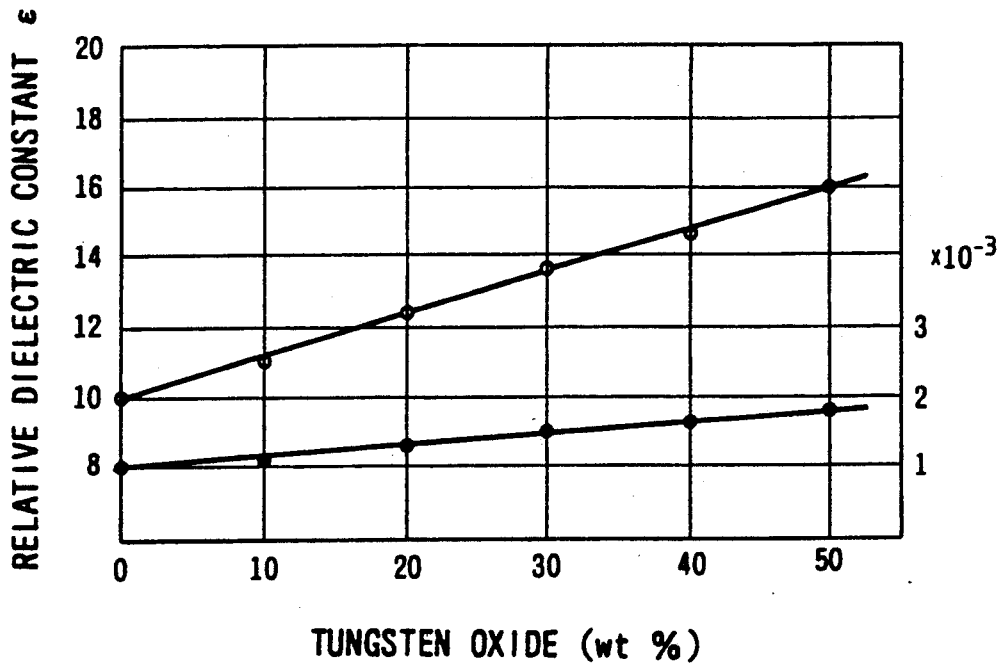
FIG. 5 is a graphical representation of the relationship between the weight percent of tungsten oxide and the relative dielectric constant of the resultant composition.

The experiment was repeated using a high dielectric material layer 2 composed of alumina and tungsten oxide. The result of the measurements are shown in FIG. 5.

EXAMPLE 4

Figure 6:
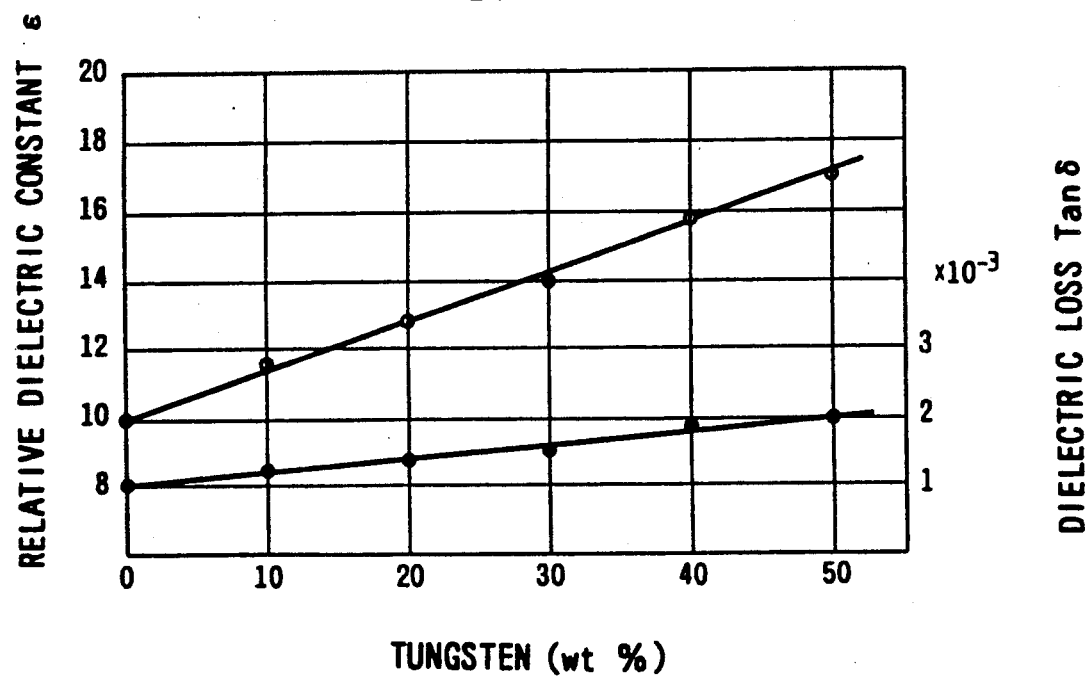
FIG. 6 shows the graphical relationship between the weight percent of tungsten and the dielectric constant of the resultant material.

The experiment was again repeated using a high dielectric material 2 composed of alumina and tungsten. The results of the measurements are shown in FIG. 6.

Effectively, the high dielectric material layer 2 of the present invention is formed by adding alumina as a basic material with an auxiliary such as molybdenum and firing the mixture. The result is a highly reliable capacitor layer which can be easily transformed into a wiring substrate of high quality and high reliability.

What is claimed:

1. A wiring substrate comprising:
   a dielectric material layer having a first dielectric material layer surface and a second dielectric material layer surface;
   a first metallized layer on said first dielectric material layer surface;
   a second metallized layer on said second dielectric material layer surface;
   a first alumina layer having an inward surface contacting said first metallized layer and an outward surface;
   a second alumina layer having an inward surface contacting said second metallized layer and an outward surface;
   a first conductor electrically connecting to and extending from said first metallized layer through said first alumina layer; and
   a second conductor electrically extending from said second metallized layer through said dielectric material layer, through but not electrically connecting said first metallized layer, and through said first alumina layer.

2. A wiring substrate according to claim 1, further comprising:
   a second electrode layer electrically extending to said second conductor at said outward surface of said first alumina layer; and
   a first electrode layer extending to said first conductor at said outward surface of said first alumina layer.

3. A wiring substrate according to claim 1, wherein said dielectric material layer comprises a dielectric material.

4. A wiring substrate according to claim 3, wherein said dielectric material comprises alumina and from 5 to 50 weight percent of said dielectric material of an auxiliary material.

5. A wiring substrate according to claim 4, wherein said auxiliary material comprises molybdenum.

6. A wiring substrate according to claim 4, wherein said auxiliary material comprises molybdenum oxide.

7. A wiring substrate according to claim 4, wherein said auxiliary material comprises tungsten.

8. A wiring substrate according to claim 4, wherein said auxiliary material comprises tungsten oxide.

9. A wiring substrate according to claim 4, wherein said auxiliary material comprises any combination of molybdenum, molybdenum oxide, tungsten, or tungsten oxide.

10. A wiring substrate according to claim 1, wherein said first metallized layer and said second metallized layer comprise primarily a high melting point metal.

11. A wiring substrate according to claim 10, wherein said high melting point metal comprises molybdenum.

12. A wiring substrate according to claim 10 wherein said high melting point metal comprises tungsten.

* * * * *

REEXAMINATION CERTIFICATE (3170th)

United States Patent [19]

Ogawa et al.

[11] B1 5,099,388

[45] Certificate Issued Apr. 8, 1997

[54] ALUMINA MULTILAYER WIRING SUBSTRATE PROVIDED WITH HIGH DIELECTRIC MATERIAL LAYER

[75] Inventors: Masahiro Ogawa, Aichi; Kozo Yamasaki, Gifu, both of Japan; Mitsuru Hirano, Santa Clara, Calif.; Michael A. Schmitt; Bidyut K. Bhattacharyya, both of Chandler, Ariz.

[73] Assignees: NGK Spark Plug Co., Ltd., Nagoya, Japan; NGK Spark Plugs (U.S.A.), Inc., Torrance, Calif.; Intel Corporation, Chandler, Ariz.

Reexamination Request:
No. 90/003,931, Aug. 28, 1995

Reexamination Certificate for:
Patent No.: 5,099,388
Issued: Mar. 24, 1992
Appl. No.: 538,334
Filed: Jun. 15, 1990

[30] Foreign Application Priority Data

Jun. 15, 1989 [JP] Japan .................. 1-153254

[51] Int. Cl.$^6$ .................. H01G 4/06; H01G 4/228; H01G 4/20; H01G 4/10
[52] U.S. Cl. .................. 361/321.2; 361/321.4; 361/306.1; 361/306.3; 361/313; 361/320; 361/322

[58] Field of Search .................. 361/306.1, 306.2, 361/306.3, 311.315, 318–322, 782; 174/250, 256–258, 261–264

[56] References Cited

U.S. PATENT DOCUMENTS

| 3,235,939 | 2/1966 | Rodriguez et al. | 29/25.42 |
| 3,760,244 | 9/1973 | McClelland, Jr. | 317/258 |
| 4,628,404 | 12/1986 | Yokoe et al. | 361/321 |
| 4,816,323 | 3/1989 | Inoue | 428/208 |
| 4,954,877 | 9/1990 | Nakanishi et al. | |

FOREIGN PATENT DOCUMENTS

| 52-45722 | 11/1977 | Japan | C04B 35/10 |
| 57-50460 | 3/1982 | Japan | H01L 27/01 |
| 58-111396 | 7/1983 | Japan | H05K 3/46 |
| 62-229711 | 10/1987 | Japan | H01B 3/12 |
| 63-182252 | 7/1988 | Japan | C04B 24/10 |
| 1119557 | 5/1989 | Japan | C04B 35/10 |

*Primary Examiner*—Bot Ledynh

[57] ABSTRACT

An alumina multilayer wiring substrate having a high dielectric, low inductance capacitor in the substrate on which a VLSI is to be mounted to effectively eliminate electrical noise(s) which may hinder the operation of the VLSI at high speed (frequency) is provided.

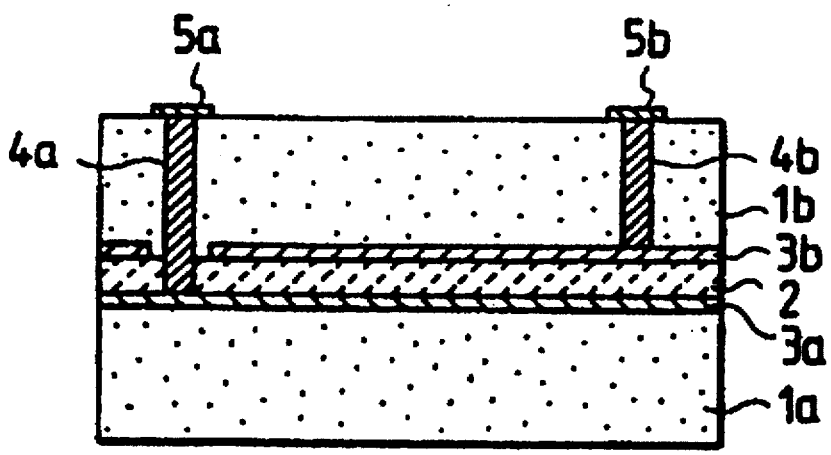

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, lines 26–62:

The present invention uses a high dielectric material as a composite for manufacturing a large number of thin ceramic sheets laminated one on the other in the vicinity of a portion of an alumina multilayer wiring substrate where a VLSI chip is to be mounted. The present invention incorporate a low inductance capacitor in the alumina multilayer wiring substrate to effectively eliminate noises of the VLSI. The high dielectric material used is a mixture of alumina, a basic material, and at least one of either molybdenum, molybdenum oxide tungsten, or tungsten oxide. The molybdenum [and other elements or compounds], *tungsten, compounds which are reduced to molybdenum upon firing, compounds which are reduced to tungsten upon firing, or mixtures thereof* added to the alumina are generally referred to *herein* as ["auxiliaries."] *"dielectric constant-raising additives."* The resultant alumina [auxiliary] *dielectric constant-raising additive* material is combined at a 5–50 weight percent (w/o) ratio where the weight percent represents the amount of the [auxiliaries] *dielectric constant-raising additives* where the total quantity of alumina and [auxiliaries] *dielectric constant-raising additives* is assumed to be 100%.

The alumina wiring substrates can be of various sizes and shapes depending upon the particular application. The alumina wiring substrate may be composed of any combination of materials as long as alumina is the main component. Various *conventional* auxiliaries may be included depending upon the intended application.

The high dielectric material may contain a mixture with any one or combination of the aforementioned [auxiliaries] *dielectric constant-raising additives*. Molybdenum or tungsten are most commonly used. Molybdenum is preferred for its ease in sintering. Tungsten is preferred because of its stability at high temperatures. If the weight percent of the [auxiliaries] *dielectric constant-raising additives* is less than 5 w/o, the effect of adding the [auxiliaries] *dielectric constant-raising additives* is negligible because the dielectric constant cannot be made sufficiently large. On the other hand, if the weight percent of the [auxiliaries] *dielectric constant-raising additives* exceeds 50 w/o, the conductivity can be increased to a level where shorting occurs. If the ratio is kept between 5–50 w/o, one can obtain excellent results without exhibiting any of the foregoing defects.

Column 4, lines 13–38:

The hydrogen atmosphere allows the molybdenum oxide to reduce and become molybdenum metal during the firing process. The same is true for the tungsten oxide. The advantage of using the oxides of these metals is that they do reduce to their metallic form during the firing process. Accordingly, any alternative compounds may be substituted for these oxides as long as the compounds reduce to molybdenum or tungsten metal after firing. The crystal structure of the high dielectric material layer 2 is represented in FIG. 1; 21 represents the alumina while 22 designates the molybdenum [oxide].

As the concentration of the molybdenum oxide is increased, so is the dielectric constant. However, if the weight percent concentration of the [auxiliary] *dielectric constant-raising additive* exceeds 50 w/o, electrical shorting may occur. If the weight percent concentration of the [auxiliary] *dielectric constant-raising additive* falls below 5 w/o, the effect of the addition is not large enough to produce a sufficiently large dielectric constant. As such, the preferred range of addition of [auxiliary] *dielectric constant-raising additive* to alumina lies between 5 and 50 w/o. It should be noted that the dielectric loss does not so increase, even if the molybdenum oxide is added to constitute 40 w/o. It is possible to create a high dielectric material layer 2 not susceptible to electrical shorting. If the molybdenum *oxide* particle size is small (0.5–3.0 μm), the reliability of the present invention increases because electrical shorting is prevented.

Column 5, lines 15–36:

The molybdenum oxide reduced in the hydrogen atmosphere during firing to leave behind [an] electrically conductive molybdenum [layer]. The same is true for tungsten. Any starting material may be alternately used as long as the composition leaves a metal molybdenum or metal tungsten in the appropriate positions after firing.

A capacitor layer constituted by a high dielectric material layer 2 of alumina 21 and molybdenum [oxide] 22 and metallized layers 3a and 3b as shown in FIG. 1 was formed, the high dielectric material layer 2 having the same component and being fired under the same condition as the foregoing case. As a result of measurement of the foregoing performance, the same values as the foregoing case were obtained. Therefore, only the above capacitor layers were formed after this, and investigation was made as to the effect of various rates of addition of molybdenum oxide (0, 20, 30, 40, and 50 w/o). From the results of the measurements, it was found that it is preferable that the dielectric constant becomes large as the quantity of molybdenum oxide added increases.

Column 6, lines 15–23:

The experiment was again repeated using a high dielectric material 2 composed of alumina and tungsten. The results of the measurements are shown in FIG. 6.

Effectively, the high dielectric material layer 2 of the present invention is formed by adding alumina as a basic material with [an auxiliary] *a dielectric constant-raising additive* such as molybdenum and firing the mixture. The result is a highly reliable capacitor layer which can be easily transformed into a wiring substrate of high quality and high reliability.

AS A RESULT OF REEXAMINATION, IT HAS BEEN DETERMINED THAT:

Claims 2–9 are cancelled.

Claim 1 is determined to be patentable as amended.

Claims 10–12, dependent on an amended claim, are determined to be patentable.

New claims 13–26 are added and determined to be patentable.

1. A wiring substrate comprising:

a dielectric material layer *comprising alumina and from 5 to 50 weight percent of said dielectric material of a dielectric constant-raising additive selected from tungsten, molybdenum, and mixtures thereof,* and having a first dielectric material layer surface and a second dielectric material layer surface;

a first metallized layer on said first dielectric material layer surface;

a second metallized layer on said second dielectric material layer surface;

a first alumina layer having *a composition different than said dielectric material,* and an inward surface contacting said first metallized layer and an outward surface;

a second alumina layer having *a composition different than said dielectric material,* and an inward surface contacting said second metallized layer and an outward surface;

a first conductor electrically connecting to and extending from said first metallized layer through said first alumina layer; and a second conductor electrically extending from said second metallized layer through said dielectric material layer, through but not electrically connecting said first metallized layer, and through said first alumina layer.

13. *A wiring substrate comprising:*

*a dielectric material layer comprising alumina and from 5 to 50 weight percent of said dielectric material layer of a dielectric constant-raising additive selected from tungsten, molybdenum, and mixtures thereof, having a microstructure in which said dielectric constant-raising additive is disposed at crystal grain boundaries of said alumina, and having a first dielectric material layer surface and a second dielectric material layer surface;*

*a first metallized layer on said first dielectric material layer surface;*

*a second metallized layer on said second dielectric material layer surface;*

*a first alumina layer having a composition different than said dielectric material, and an inward surface contacting said first metallized layer and an outward surface;*

*a second alumina layer having a composition different than said dielectric material, and an inward surface contacting said second metallized layer and an outward surface;*

*a first conductor electrically connecting to and extending from said first metallized layer through said first alumina layer; and*

*a second conductor electrically extending from said second metallized layer through said dielectric material layer, through, but not electrically connecting said first metallized layer, and through said first alumina layer.*

14. *The wiring substrate according to claim 13, wherein said first metallized layer and said second metallized layer comprise primarily a high melting point metal.*

15. *The wiring substrate according to claim 14, wherein said high melting point metal comprises molybdenum.*

16. *The wiring substrate according to claim 14, wherein said high melting point metal comprises tungsten.*

17. *A wiring substrate formed from an unfired substrate, said unfired substrate comprising:*

*an unfired dielectric material layer comprising alumina and from 5 to 50 weight percent of said unfired dielectric material layer of a dielectric constant-raising additive selected from tungsten, compounds which reduce to tungsten upon firing, molybdenum, compounds which reduced to molybdenum upon firing, and mixtures thereof, and having a first unfired dielectric material layer surface and a second unfired dielectric material layer surface;*

*a first unfired metallized layer on said first unfired dielectric material layer surface;*

*a second unfired metallized layer on said second unfired dielectric material layer surface;*

*a first unfired alumina layer having an inward surface contacting said first unfired metallized layer and an outward surface;*

*a second unfired alumina layer having an inward surface contacting said second unfired metallized layer and an outward surface;*

*a first unfired conductor electrically connecting to and extending from said first unfired metallized layer through said first unfired alumina layer; and*

*a second unfired conductor electrically extending from said second unfired metallized layer through said unfired dielectric material layer, through, but not electrically connecting said first unfired metallized layer, and through said first unfired alumina layer.*

18. *The wiring substrate according to claim 17, wherein said first unfired metallized layer and said second unfired metallized layer comprise primarily a high melting point metal.*

19. *The wiring substrate according to claim 18, wherein said high melting point metal comprises molybdenum.*

20. *The wiring substrate according to claim 18, wherein said high melting point metal comprises tungsten.*

21. *The wiring substrate according to claim 17, wherein said compound which reduces to tungsten upon firing is tungsten oxide.*

22. *The wiring substrate according to claim 17, wherein said compound which reduces to molybdenum upon firing is molybdenum oxide.*

23. *A wiring substrate comprising:*

*a dielectric material layer comprising alumina and from 5 to 50 weight percent of said dielectric material of a dielectric constant-raising additive selected from tungsten, molybdenum, and mixtures thereof, and having a first dielectric material layer surface and a second dielectric material layer surface;*

*a first metallized layer on said first dielectric material layer surface;*

*a second metallized layer on said second dielectric material layer surface;*

*a first alumina layer having an inward surface contacting said first metallized layer and an outward surface;*

*a second alumina layer having an inward surface contacting said second metallized layer and an outward surface;*

*a first conductor electrically connecting to and extending from said first metallized layer through said first alumina layer; and* a second conductor electrically extending from said second metallized layer through said dielectric material layer, through but not electrically connecting said first metallized layer, and through said first alumina layer, wherein said dielectric material has a dielectric constant higher than said first and second alumina layers.

24. The wiring substrate according to claim 23, wherein said first metallized layer and said second metallized layer comprise primarily a high melting point metal.

25. The wiring substrate according to claim 24, wherein said high melting point metal comprises molybdenum.

26. The wiring substrate according to claim 24, wherein said high melting point metal comprises tungsten.

* * * * *